(12) United States Patent
Wilson et al.

(10) Patent No.: US 10,930,837 B2
(45) Date of Patent: Feb. 23, 2021

(54) HTS MAGNET SECTIONS

(71) Applicant: TOKAMAK ENERGY LTD, Oxfordshire (GB)

(72) Inventors: Martin Wilson, Oxfordshire (GB); Paul Noonan, Oxfordshire (GB)

(73) Assignee: TOKAMAK ENERGY LTD, Abingdon (GB)

( * ) Notice: Subject to any disclaimer, the term of this patent is extended or adjusted under 35 U.S.C. 154(b) by 428 days.

(21) Appl. No.: 15/757,099

(22) PCT Filed: Sep. 5, 2016

(86) PCT No.: PCT/GB2016/052725
§ 371 (c)(1),
(2) Date: Mar. 2, 2018

(87) PCT Pub. No.: WO2017/042543
PCT Pub. Date: Mar. 16, 2017

(65) Prior Publication Data
US 2018/0261753 A1    Sep. 13, 2018

(30) Foreign Application Priority Data

Sep. 9, 2015 (GB) .................................... 1515978

(51) Int. Cl.
*H01L 39/14* (2006.01)
*H01F 6/06* (2006.01)
*H01B 12/16* (2006.01)
*H01F 41/04* (2006.01)
*G21B 1/05* (2006.01)

(52) U.S. Cl.
CPC ............ *H01L 39/143* (2013.01); *G21B 1/057* (2013.01); *H01B 12/16* (2013.01); *H01F 6/06* (2013.01); *H01F 41/048* (2013.01); *Y02E 30/10* (2013.01)

(58) Field of Classification Search
None
See application file for complete search history.

(56) References Cited

U.S. PATENT DOCUMENTS 5,122,772 A     6/1992  Shimamoto et al.
2006/0073979 A1*  4/2006  Thieme ................. H01L 39/248
                                                505/434
2012/0028807 A1    2/2012  Shinzato et al.
(Continued)

FOREIGN PATENT DOCUMENTS

CN    1160454 A    9/1997
CN    1385951 A    12/2002
(Continued)

OTHER PUBLICATIONS

Japanese Office Action dated Oct. 16, 2018; 5pgs.
(Continued)

*Primary Examiner* — Paul A Wartalowicz
(74) *Attorney, Agent, or Firm* — Cantor Colburn LLP

(57) ABSTRACT

There is disclosed an assembly for carrying electrical current in a coil of a magnet. The assembly comprises a pre-formed housing of thermally and electrically conductive material (e.g. copper) which comprises a channel configured to retain HTS tape. A plurality of layers of HTS tape are fixed within the channel. The channel has at least one pre-formed curved section.

11 Claims, 3 Drawing Sheets

(56) References Cited

U.S. PATENT DOCUMENTS

2013/0203604 A1   8/2013   Usoskin
2014/0243207 A1   8/2014   Takayasu

FOREIGN PATENT DOCUMENTS

| | | |
|---|---|---|
| CN | 101292369 A | 10/2008 |
| CN | 102362318 A | 2/2012 |
| CN | 102792396 A | 11/2012 |
| EP | 1261112 A2 | 11/2002 |
| GB | 2494185 A | 3/2013 |
| GB | 2510447 A | 8/2014 |
| JP | S5544739 A | 3/1980 |
| JP | S5866308 A | 4/1983 |
| JP | H10507589 A | 7/1998 |
| JP | H10214713 A | 8/1998 |
| JP | 2001217118 A | 8/2001 |
| JP | 2009503794 A | 1/2009 |
| JP | 2013131690 A1 | 7/2013 |
| RU | 2374711 C2 | 11/2009 |
| WO | 9612288 A1 | 4/1996 |
| WO | 2011118501 A1 | 9/2011 |
| WO | 2012013205 A2 | 2/2012 |
| WO | 2014089540 | 6/2014 |

OTHER PUBLICATIONS

Chinese Office Action for Application No. 201680052152.3 dated Jan. 11, 2019; 10 pgs.

Russian Office Action for Application No. 2018112455 dated Oct. 25, 2018; 2 pgs.

Bromberg, L., et al, "Status of High Temperature Superconducting Magnet Development", Dec. 2010, Retrieved from Internet: URL: http://www.psfc.mit.edu; XP002732544.

Great Britian Search Report for Application No. GB1515978.3 dated Jan. 26, 2016; 4 pgs.

International Search Report and Written Opinion for International Application No. PCT/GB2016/052725 dated Dec. 19, 2016; 14 pgs.

* cited by examiner

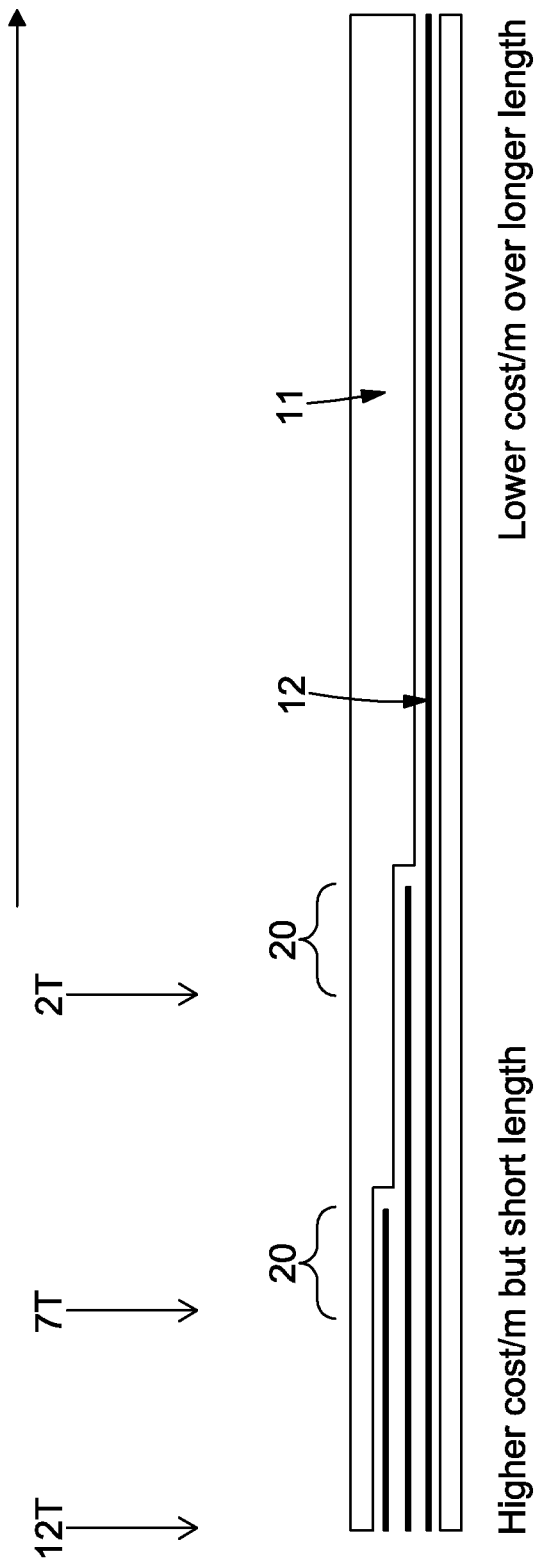

HTS MAGNET SECTIONS

FIELD OF THE INVENTION

The present invention relates to the manufacture of superconducting magnets. In particular, the invention relates to the formation of HTS magnets.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore reach much higher fields than conventional electromagnets.

Superconductivity only occurs in certain materials, and only at low temperatures. A superconducting material will behave as a superconductor in a region defined by the critical temperature of the superconductor (the highest temperature at which the material is a superconductor in zero magnetic field) and the critical field of the superconductor (the highest magnetic field in which the material is a superconductor at 0 K). The temperature of the superconductor and the magnetic field present limit the current which can be carried by the superconductor without the superconductor becoming resistive.

Broadly speaking, there are two types of superconducting material. Low temperature superconductors (LTS) have critical temperatures below 30-40 K, and high temperature superconductors (HTS) have critical temperatures above 30-40 K. Many current HTS materials have critical temperatures above 77 K, which allows the use of liquid nitrogen for cooling.

In order to make a superconducting magnet using HTS, the HTS is typically formed into tapes. FIG. 1 is a schematic illustration of the components of a typical HTS tape 200. Such tape 200 is generally approximately 100 microns thick, and includes an electropolished hastelloy substrate 201 approximately 50 microns thick, on which is deposited by IBAD or magnetron sputtering a series of buffer stack layers 202, each approximately 0.2 microns thick. An epitaxial (RE)BCO-HTS layer 203 (deposited by MOCVD or another technique) overlays the buffer layer, and is typically 1-5 microns thick. A two micron silver layer 204 is deposited on the HTS layer by sputtering, and 20 micron copper stabilizer layers 205 are electroplated onto both sides of the tape. The tapes are formed into cables, which are then wound to form the windings of the magnet. Possible cable structures include winding the tapes around a copper core, or stacking the tapes in layers so that the bottom face of one tape lies directly on top of the top face of the next tape.

Manufacturing the magnets in this way has several disadvantages. Firstly, to form the complete windings, the cables must be very long, which presents a manufacturing challenge when making the HTS tape, and means that the cost of replacing damaged tape is high. Secondly, winding the magnets in this way means that larger superconducting magnets must normally be constructed on site, as the completed magnet is too large to move easily. Thirdly, the use of cables restricts the possible configurations of HTS tape, for example cables formed from stacked tapes have a minimum bend radius, as any strain on the tapes greater than 0.2% will prevent the tape from superconducting. For example, a stack of tapes 16.5 mm high would have a minimum bend radius of 4125 mm—which would make a toroidal field coil using such cables a minimum of 16 m across. Fourthly, the number of tapes in a cable is effectively determined by the highest magnetic field which that cable is exposed to—a cable in a toroidal field coil which experiences a very high field in the central column but a lower field in the return limb must still have enough tape over the whole of its length to function in the high field, even though much less would be necessary in the lower field.

Current cable designs also make it difficult to join HTS cables together. Joints using resistive conductors can be used, but add significant heat load, so ideally the tapes in one cable should come into very close proximity to the tapes in the other cable, to reduce the resistance of the joint. This can be done by layup of tapes at the ends of bespoke cable lengths, but it would be difficult or even impossible with flexible cables of uniform cross section manufactured in long lengths.

US 2006/073979 A1 and EP 1261112 A2 each disclose HTS cables having a copper housing into which HTS tapes are soldered.

SUMMARY

In accordance with one aspect of the present invention there is provided an assembly for carrying electrical current in a coil of a magnet. The assembly comprises a pre-formed housing which comprises a channel configured to retain HTS tape. A plurality of layers of HTS tape are fixed within the channel. The channel includes at least one pre-formed curved section. The pre-formed housing may be formed of thermally and electrically conductive material such as copper.

The pre-formed curved section has a radius of curvature which is less than a total thickness of the layers of HTS tape in that section divided by twice a maximum permitted strain of the HTS tape.

The assembly may comprise a joint region. The HTS tape in the joint region may be positioned on an outer surface of the assembly, such that the HTS tape is brought into contact with HTS tape of a corresponding assembly when the outer surfaces of the joint regions of the assemblies are brought together. Such joint regions allow coils to be formed of many such assemblies, and individual sections of coils can then be inserted and removed as required.

The housing may comprise one or more coolant channels to allow coolant to flow through the assembly.

The invention also provides a section of a field coil of a superconducting magnet comprising an assembly as described above, and a field coil comprising a plurality of such sections.

In accordance with one embodiment there is provided a toroidal field coil for generating a toroidal magnetic field in a toroidal nuclear fusion reactor. The coil comprises a central column and a plurality of return limbs, each comprising at least one section as described above. The central column may be detachable from the return limbs and may be replaceable. Sections which pass through the centre of the central column may contain fewer layers of superconducting tape than sections which pass through the central column further from the centre.

The return limbs may be configured such that regions of the return limb which are furthest from the central column while in use have fewer layers of superconducting tape than regions which are closer to the central column. Each return limb may be configured such that the distance between tapes in the return limb is greater in regions of the return limb which are further from the central column and lower in regions of the return limb which are closer to the central column. Each return limb may be split so as to reduce the self-field.

In accordance with an embodiment there is provided a nuclear fusion reactor comprising a toroidal field coil as described above and/or a poloidal field coil incorporating one or more sections as described above.

In accordance with another aspect of the present invention there is provided a method of manufacturing an assembly for carrying electrical current in a coil of a magnet. The method comprises forming a housing having a required shape of the assembly, the housing comprising at least one channel configured to retain HTS tape. A plurality of layers of HTS tape are individually laid into the channel and fixed within the channel. The channel has at least one pre-formed curved section. The pre-formed curved section has a radius of curvature in at least one section which is less than a total thickness of the layers of HTS tape in that section divided by twice a maximum permitted strain of the HTS tape. Fixing the HTS tape within the channel may comprise soldering the HTS tape to copper of the housing using low temperature solder.

Further embodiments of the invention are set out in claim 2 et seq.

BRIEF DESCRIPTION OF THE DRAWINGS

FIG. 3 is a schematic illustration of a return limb of a toroidal field coil according to an embodiment;

DETAILED DESCRIPTION

Figure 1:
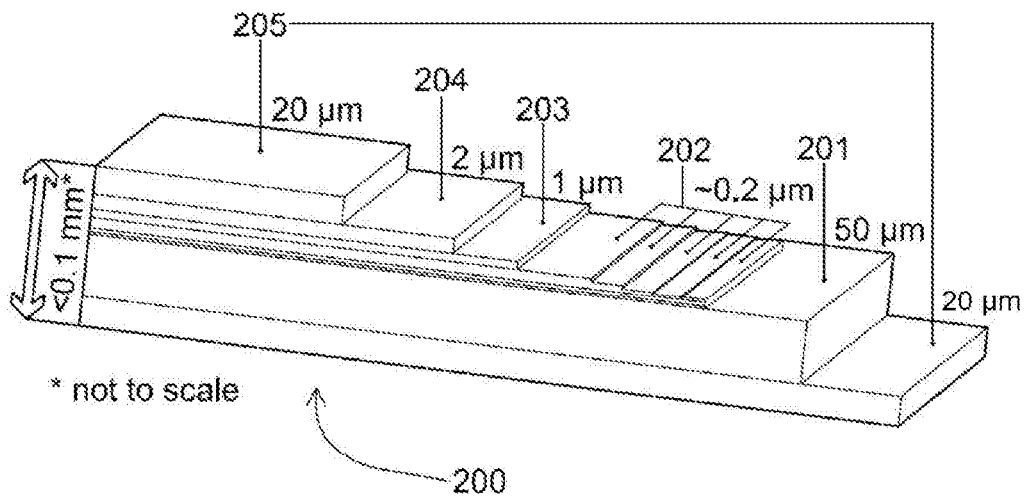
FIG. 1 is a schematic illustration of the components of standard HTS tape.

In order to overcome the above problems, an alternative construction for HTS magnets is proposed below. Rather than using cables, a rigid or semi-rigid housing is pre-formed in the desired shape, with a channel configured to retain HTS tape. The housing should be generally rigid but it will be appreciated that it could be slightly bent around any combination of axes, compressed or stretched after it is made so long as the maximum permitted strain of the tapes within the assembly is not exceeded. The housing should not be flexible enough to wind as a coil (as with conventional FITS cables), but instead it should be rigid enough that it essentially holds its shape. The housing may be made from a material such as copper having high thermal and electrical conductivity, or a material with high strength and stiffness such as stainless steel, or a combination of both. The HTS tape is then laid individually in the channel, and fixed in place. The construction will be described primarily in terms of a toroidal field coil (as might be used, for example, in a plasma vessel such as a spherical tokamak for use as a nuclear fusion reactor), as this geometry demonstrates many of the advantages of the construction, but the skilled person will appreciate that this construction can be used with any superconducting magnet geometry.

For a stack of tapes in a conventional cable (i.e. one which is formed as a straight and then bent), the minimum bend radius, r, is given by the thickness of the stack, t, divided by twice the maximum permitted strain, e, i.e. $r=t/(2e)$, where the maximum permitted strain is given in %. For example, for a 10 mm deep stack where the maximum permitted strain is 0.2%, introducing any curve with a radius less than 2500 mm would damage the tape. The maximum permitted strain is the strain at which the performance of the tape drops below acceptable values. Example values of the maximum permitted strain may be the "irreversible strain" (i.e the strain at which the tape does not recover when the strain is removed), or the strain at which the current capacity of the tape drops to 90% of the unstrained current capacity.

Laying the HTS tape individually in a pre-shaped channel allows much tighter bends to be made than with a conventional stacked HTS tape cable. The minimum bend radius is determined by the thickness of an individual tape (approx 0.1 mm), rather than the thickness of the stack, which means that it could be as low as 25 mm. In practice, such tight bends are unlikely to be necessary, but this gives significantly more allowance for strain caused by Lorentz and thermal stresses. For the toroidal field coil of a spherical tokamak nuclear fusion reactor, each current carrying assembly can contain a greater number of tapes than would be possible with a conventional HTS cable, which means that the central column can be made more compact.

The bending of the HTS tapes should preferably be limited to bending about axes parallel to the plane of the HTS material (usually known as a,b axes), since bending about the c-axis perpendicular to the FITS tape is subject to much tighter restrictions on radius. The housing may be configured such that the tape is twisted about the long axis to avoid such bends. Alternatively, the channel may be made such that the tape can be laid in with a twist about the long axis where necessary, without specifically introducing such twists into the channel.

The HTS tape may be fixed in place using, for example, low temperature solder or a resin or plastic binding.

Figure 2:
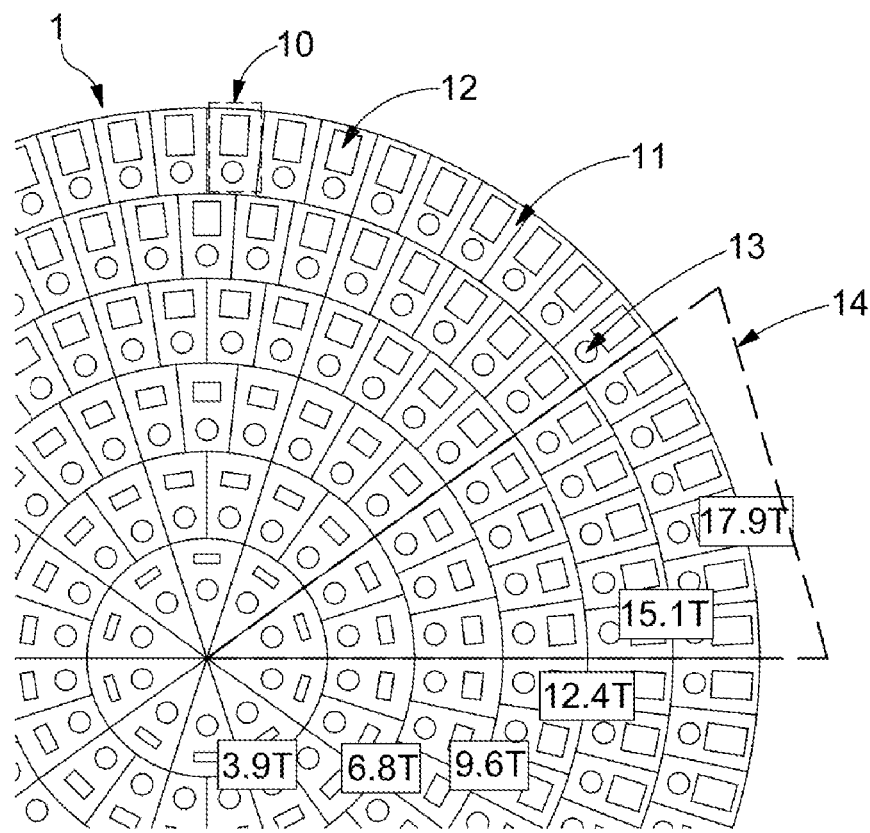
FIG. 2 is a cross section of a central column of a toroidal field coil according to an embodiment.

FIG. 2 shows a cross section of a central column of a toroidal field coil 1 comprising several current carrying assemblies. Each assembly 10 comprises a copper housing 11 with a channel configured to retain HTS tape 12 and a coolant channel 13, and a stack 12 of HTS tape. The number of tapes in each stack varies within the central column, with more tapes being provided in regions of higher magnetic field (towards the outside of the column), as the current which can be carried by each tape is reduced in high field regions. In this example the assemblies 10 are arranged in ten sections or segments 14, with each segment comprising twenty-one assemblies in six rows.

The layout shown in FIG. 2 mimics what would be possible with conventional HTS cables, but other configurations are also possible. For example, each of the ten segments 14 could comprise a stack of curved copper sheets with the appropriate number of tapes soldered to channels in their surface, and radial gaps between then to allow for cooling. In principle the entire centre column could comprise complete concentric copper cylinders with tapes soldered to channels in their surface.

The current carrying assemblies can be configured so that the tape configuration differs as required for different parts of the superconducting magnet. For example, the tapes in the return limbs of the toroidal field coil may be spread out to reduce the field on the HTS in the return limbs (which will also create space to allow better support to be provided for Lorentz stress). This reduced field means that fewer tapes are required in the return limb compared to the central column. A similar spread out construction may be used for the poloidal field coils. FIG. 3 illustrates schematically a "straightened out" return limb with illustrative field strengths. A greater number of tapes is provided in areas which experience greater fields, and a smaller number of tapes in areas which experience lower fields. In areas 20 where current is transferred, the field is low enough for the reduced number of tapes to carry the current, but some overlap is allowed so that current can redistribute between the tapes with minimal resistance.

As well as the number of tapes varying along the length of the current carrying assembly, the cross section of the assembly may vary along its length, e.g. to provide greater thickness of copper in certain sections, or to spread tapes out in the return limbs in order to reduce the self-field on the return limbs.

Alternatively or additionally to varying the number of tapes, the "quality" of tapes used may be varied along the length of the assembly. In this context, "higher quality" tapes can support a higher current density in higher magnetic fields and are therefore more expensive. For example higher quality tapes may be used in sections with a high self-field and lower quality tapes may be used in sections where the self-field is lower. Either of these measures allows sufficient current carrying capacity to be present in regions where it is necessary for stability of the magnet, whilst still allowing less costly constructions to be used in other regions.

Figure 4C:
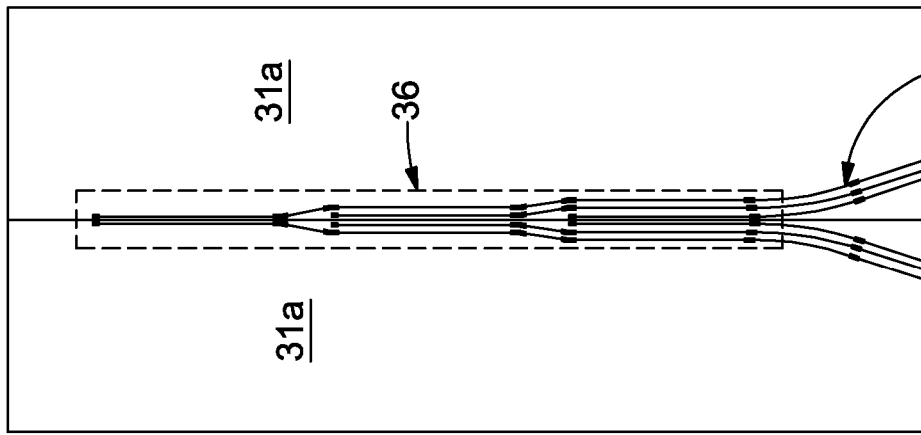
FIGS. 4a, 4b, and 4c are schematic illustrations of a joint according to an embodiment.
Figure 4B:
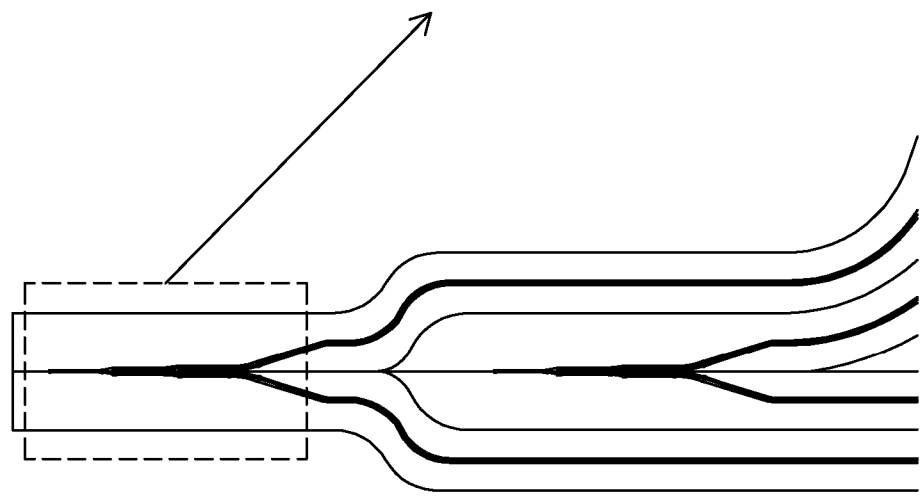
Figure 4A:
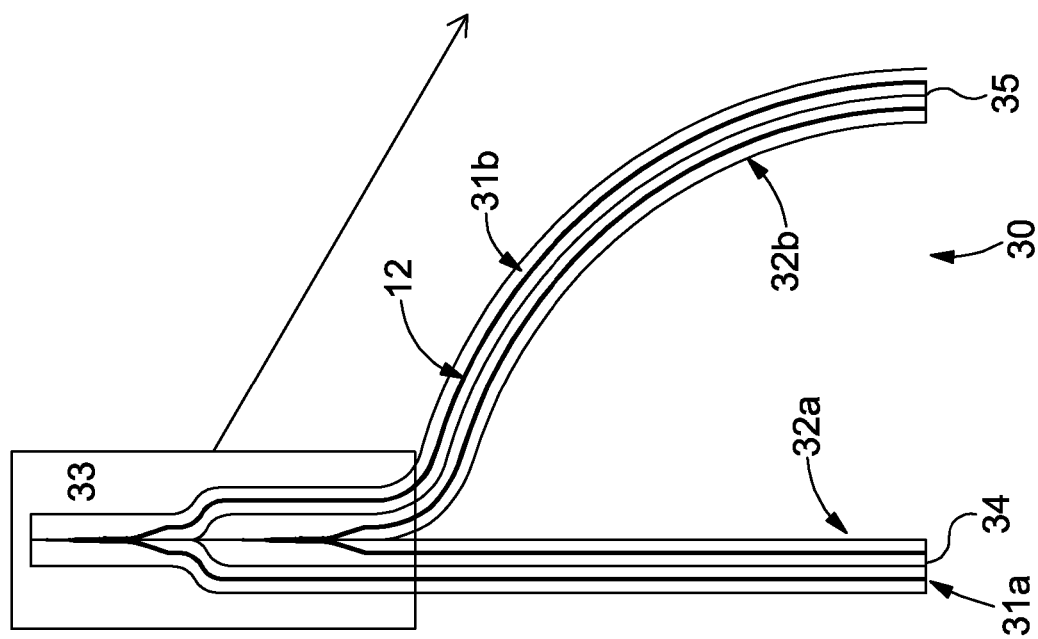

The precise control of the positioning of individual tapes within the current carrying assemblies enables joints between assemblies to be made, as the tapes of joining assemblies can be precisely positioned relative to each other. As an example, FIGS. 4a to 4c show "praying hands" joints between the central column 34 and return limb 35 of a toroidal field coil 30. Both the central column and return limb are shown as having two loops 31 and 32, each of which is formed of two current carrying assemblies 31a, 31b, 32a, 32b which meet at a joint 33. The copper housing 11 is shaped so that the joint areas can be brought into contact, and the HTS channel is machined into the copper so as to allow tape-to-tape contact in the joint area. The tapes 12 are positioned so that each tape extends for some distance on the surface, and parallel to the surface at the joint, to allow a relatively large region 36 of tape-to-tape contact and thus a low resistance. In the example shown in FIG. 4c, the number of tapes on each side of the joint is equal, but this does not need to be the case so long as there is sufficient contact between tapes on each side.

A similar joint may be formed where the two "hands" of the joint point in opposite directions (e.g. reflecting the right hand assembly in FIG. 4c about a horizontal line, so that the HTS tape exits the top of the figure).

Having joints in the superconducting magnet presents several advantages. Firstly, it allows the assemblies to be made in smaller sections. This means that large magnets can be constructed in several pieces small enough to transport, which can be made off site and moved to the planned location of the magnet. Using smaller sections also allows easier construction of certain geometries, for example a spherical tokamak reactor has both a poloidal and toroidal field coil, and conventional construction has the poloidal field coil outside of the toroidal field coil. If the central column of the toroidal field coil can be inserted, and the return limbs attached only after the poloidal field coil is completed, then the poloidal field coil can be easily placed inside the toroidal field coil, which produces a better magnetic field for plasma confinement as well as reducing the size and cost of the poloidal field coils and their power supplies and reducing the external magnetic field of the tokamak.

Both the toroidal and poloidal field coil of a spherical tokamak reactor may be made according to the construction described here, either as entire field coils with no joints, or as jointed sections.

Considering again a spherical tokamak reactor, one of the issues when designing such a reactor is the need to minimise the diameter of the central column (as this increases the efficiency of the reactor). However, HTS tape is sensitive to neutron damage, and so shielding is required to ensure that the tape can survive the high neutron environment. This shielding adds significantly to the thickness of the central column, and reduces the field strength at the outside of the central column (as the current carrying portion is deeper within the central column). If the central column can be removed and replaced, then it could be treated as effectively a disposable part, and provided with reduced shielding and replaced every few months or years (rather than being expected to last for the lifetime of the reactor). When the central column is treated as disposable, the amount of quench protection in the column (e.g. copper to provide alternative current paths and quench detection systems) could be reduced or eliminated entirely, as the central column could be replaced in the event of damage due to a quench. The joints thus allow simple "once-only" assembly of coils having topography difficult to achieve from "wound" coils. Joints also enable individual parts of magnets (such as the central column of a toroidal field coil) to be removed or replaced.

The joints involve some resistance (though increasing the joint area keeps this to a minimum), so will generate some additional heat load on the cryogenic system. There is therefore a tradeoff between the advantages of having multiple smaller sections, and the disadvantages of having many joints. This can be mitigated by having extra cooling which specifically targets the joints. In addition, where the magnet is a toroidal field coil used in a nuclear fusion reactor, the heating caused by the joints is relatively low compared to the heat experienced in the central column, and so does not place significant extra load on the cryogenic system.

The invention claimed is:

1. An assembly for carrying electrical current in a coil of a magnet, comprising:
   a pre-formed housing comprising a channel configured to retain HTS tape, the channel including at least one pre-formed curved section; and
   a plurality of layers of HTS tape fixed within the channel;
   wherein the pre-formed curved section has a radius of curvature which is less than a total thickness of the layers of HTS tape in that section divided by twice a maximum permitted strain of the HTS tape.

2. An assembly according to claim 1, wherein the pre-formed curved section is curved in such a way that the layers of HTS tape fixed within the channel are bent only around an axis or axes parallel to a plane of the HTS tape.

3. An assembly according to claim 2, wherein the channel includes a twist to enable HTS tape to be curved in two planes around the axes parallel to the plane of the HTS tape as it is laid into the channel.

4. An assembly according to claim 1, wherein the pre-formed housing is substantially rigid.

5. An assembly according to claim 1, wherein a cross section of the pre-formed housing varies over at least a section of its length.

6. An assembly according to claim 1, wherein a number of layers of HTS tape varies along the length of the assembly.

7. An assembly according to claim 1, wherein a current carrying capacity of the HTS tape varies along the length of the assembly.

8. An assembly according to claim 1, and comprising a joint region, wherein the HTS tape in the joint region is positioned on an outer surface of the assembly, such that the HTS tape is brought into contact with HTS tape of a corresponding assembly when the outer surfaces of the joint regions of said assemblies are brought together.

9. An assembly according to claim 1, wherein the housing comprises one or more coolant channels configured to allow a coolant to flow through the assembly.

10. An assembly according to claim 1, wherein the housing is formed from thermally and electrically conductive material.

11. An assembly according to claim 10, wherein the thermally and electrically conductive material comprises copper.

\* \* \* \* \*